United States Patent
Kanda et al.

(10) Patent No.: US 9,341,901 B2
(45) Date of Patent: May 17, 2016

(54) DISPLAY DEVICE

(71) Applicant: Japan Display Inc., Tokyo (JP)

(72) Inventors: Noriyoshi Kanda, Tokyo (JP);
Shigesumi Araki, Tokyo (JP);
Mitsutaka Okita, Tokyo (JP); Hirohisa Miki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/801,265

(22) Filed: Jul. 16, 2015

(65) Prior Publication Data

US 2016/0018708 A1  Jan. 21, 2016

(30) Foreign Application Priority Data

Jul. 18, 2014  (JP) .................. 2014-147724

(51) Int. Cl.
| | |
|---|---|
| H01L 29/84 | (2006.01) |
| G02F 1/1362 | (2006.01) |
| G02F 1/1333 | (2006.01) |
| G02F 1/1368 | (2006.01) |
| G02F 1/1337 | (2006.01) |
| G02F 1/1343 | (2006.01) |
| H01L 27/12 | (2006.01) |

(52) U.S. Cl.
CPC ........ *G02F 1/136209* (2013.01); *G02F 1/1337* (2013.01); *G02F 1/1368* (2013.01); *G02F 1/13338* (2013.01); *G02F 1/134309* (2013.01); *H01L 27/124* (2013.01); *G02F 2001/134345* (2013.01)

(58) Field of Classification Search
CPC .................. H01L 27/124; G02F 1/136209
USPC ........................................... 257/254
See application file for complete search history.

(56) References Cited

U.S. PATENT DOCUMENTS

2009/0160822 A1  6/2009  Eguchi et al.

FOREIGN PATENT DOCUMENTS

JP  2009-151138 A  7/2000

*Primary Examiner* — Anthony Ho
(74) *Attorney, Agent, or Firm* — TYPHA IP LLC

(57) ABSTRACT

A display device is provided that inhibits color mixture between adjacent subpixels and allows for obtaining a high-quality image. The display device includes a display area on which a light-blocking metal layer, a black matrix, and a plurality of subpixels are arranged, wherein the plurality of subpixels are arranged adjacent to one another via a black matrix as seen vertically from above, the black matrix and the light-blocking metal layer are arranged to overlap each other as seen vertically from above, and the light-blocking metal layer 130 is arranged on the bank of an organic flattened film.

15 Claims, 12 Drawing Sheets

F I G . 1 0 B

DISPLAY DEVICE

CLAIM OF PRIORITY

The present application claims priority from Japanese patent application JP 2014-147724 filed on Jul. 18, 2014 the content of which is hereby incorporated by reference into this application.

BACKGROUND OF THE INVENTION

1. Field of the Invention

The present invention relates to a display device.

2. Description of the Related Art

A touch panel is configured to recognize a position on the touch panel touched by a pen or a finger and to use the positional information as an input signal for driving. A display device having such a touch panel has become popular because it does not need an external input device such as a keyboard or a mouse, and there has also been developed a liquid crystal display device incorporating a touch sensor in a liquid crystal panel (see, for example, Japanese Patent Application Laid-Open No. 2009-151138).

The inventors reviewed a display device structured to have a metal wiring (hereinafter, referred to as auxiliary wiring or light-blocking metal layer) in a region with the light blocked out by a black matrix in order to reduce resistance of a transparent electrode (ITO) used as a touch sensor wiring in a display device incorporating the touch sensor therein.

The display device reviewed by the inventors is described with reference to FIGS. 10A and 10B.

Figure 10A:
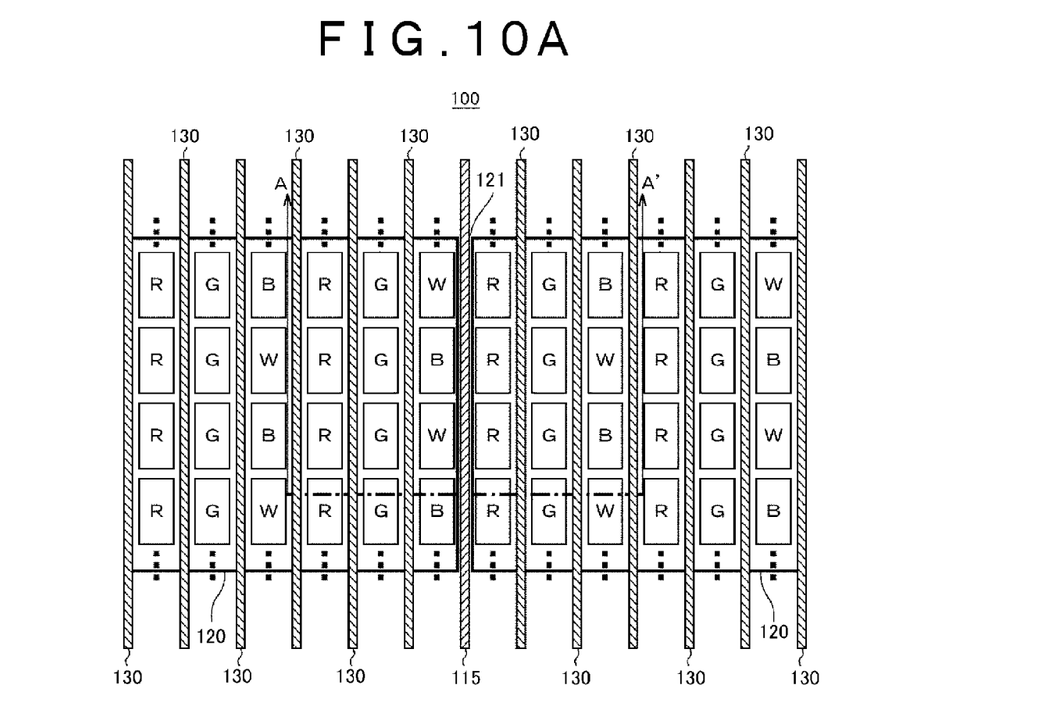
FIG. 10A is a main part schematic plan view of the display device incorporating the touch panel therein as reviewed by the inventors.
Figure 10B:
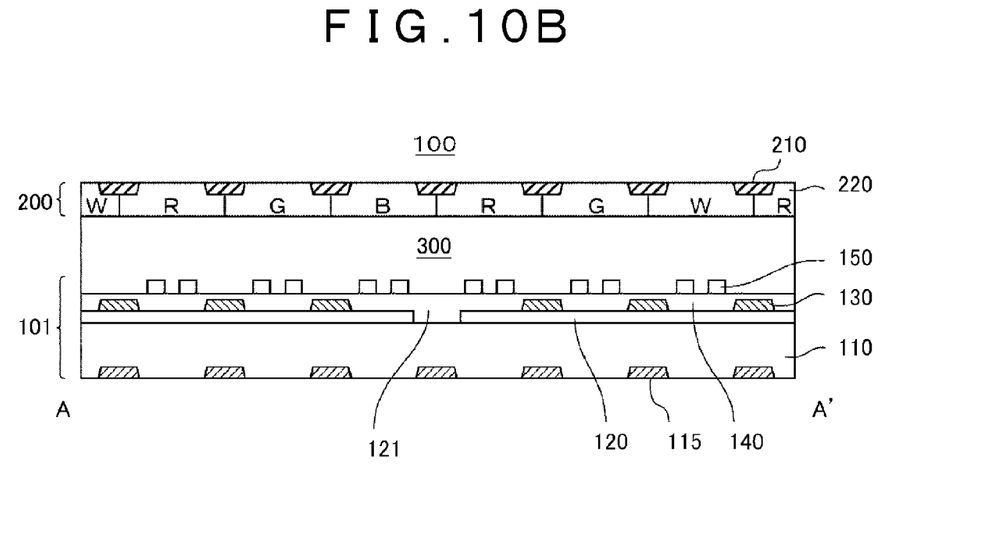
FIG. 10B is a main part schematic cross-sectional view of the display device incorporating the touch panel therein as reviewed by the inventors.

FIG. 10A is a plan view for illustrating a configuration of the display device in its display area. FIG. 10B is a cross-sectional view along a line A-A' in FIG. 10A (some parts such as the black matrix are omitted in the plan view).

The display device 100 includes subpixels of red (R), green (G), blue (B), and white (W) in a vertical stripe shape, where RGB and RGW are respectively regarded as a single pixel, and the RGB pixels and the RGW pixels are arranged alternately. The number of each of B and W is half of that of R or G. The display device 100 includes a TFT substrate (array substrate) 101, a counter substrate 200, and a liquid crystal 300 arranged between the array substrate 101 and the counter substrate 200.

In the array substrate 101, a common electrode 120 is placed on a signal wiring (video signal line) 115 via an organic flattened film (HRC) 110. A pixel electrode 150 is placed on the common electrode 120 via an interlayer insulating film (an inorganic insulating film such as SiN) 140. The common electrode 120 extends in a direction parallel to a video signal line 115 (vertical direction in FIG. 10A) and is divided in a direction perpendicular to the video signal line 115 (lateral direction in FIG. 10A) by a common electrode slit portion 121 to be periodically arranged, and an auxiliary wiring 130 is arranged on the video signal line 115 in electrical contact with the common electrode 120. The auxiliary wiring 130 is arranged in a position overlapping a black matrix 210 as seen vertically from above between subpixels of different colors. In order that the divided common electrodes 120 may not short-circuit one another, however, the auxiliary wiring 130 is not arranged in the divided region (common electrode slit portion) 121 of the common electrode 120. The common electrode 120 and the pixel electrode 150 are formed of a translucent conductor film such as ITO (Indium Tin Oxide), and the auxiliary wiring 130 and the video signal line 115 are formed of a light-blocking conductor film (low-resistance conductor film, metal film).

The counter substrate 200 includes the black matrix (BM, light-blocking layer) 210 and RGBW color filters (colored layer) 220. The color filters 220 are arranged in the order of R, G, B, R, G, W in the extending direction of the video signal line 115 and the vertical direction (lateral direction in FIG. 10A) in the repeated manner. As for R and G color filters 220, those of the same color are aligned in the extending direction of the video signal line 115, whereas B and W filters are alternately arranged.

In the conventional display device without a touch sensor, a source metal wiring (signal wiring, video signal line) or the like is arranged on the array substrate side and the black matrix or the like is arranged on the counter substrate (CF substrate) side between subpixels of different colors, thereby blocking the light from an adjacent subpixel to prevent color mixture. However, as the high definition is developed, it is required to reduce the width of the metal wiring or the width of the black matrix, and the color mixture has been prevented by improving the effect of blocking the light from the adjacent subpixel by increasing the thickness of the metal wire, the thickness of the black matrix, or the both.

Figure 7A:
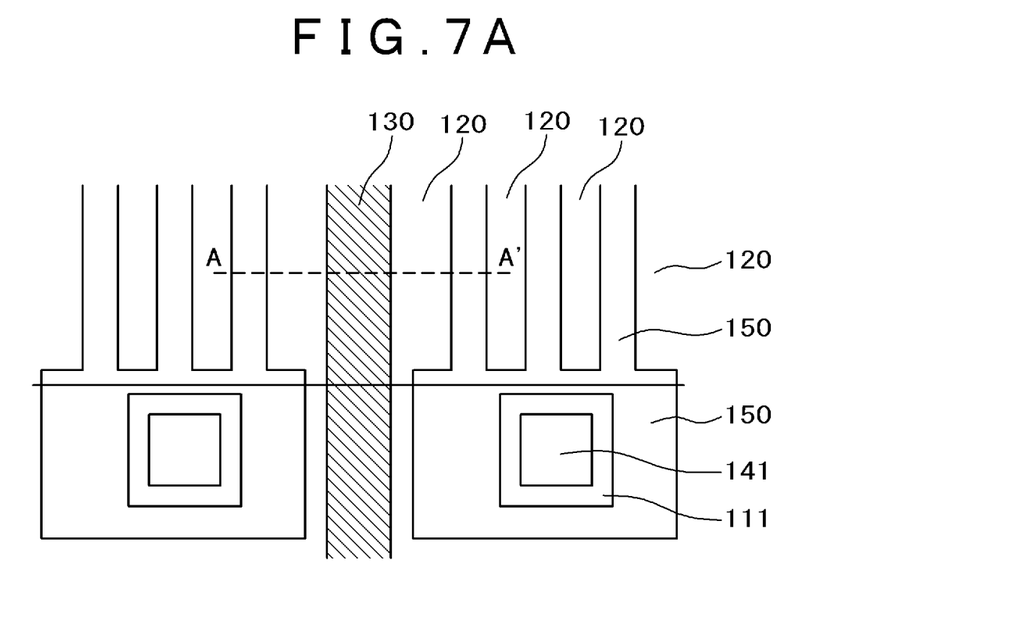
FIG. 7A is a plan view schematically showing the main part (a region in which a common electrode is not divided) of a display device incorporating a touch panel therein as reviewed by the inventors.
Figure 7B:
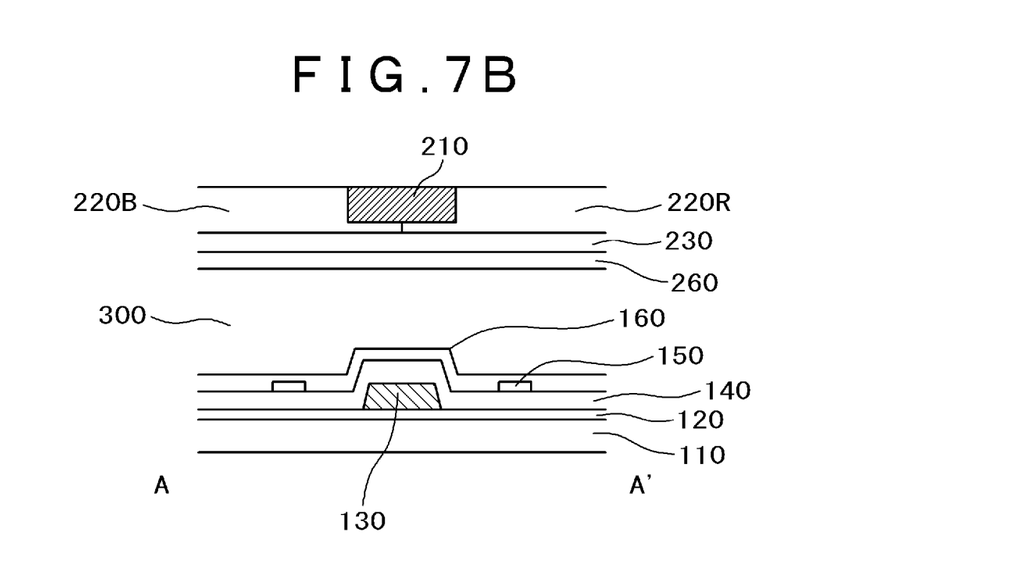
FIG. 7B is a cross-sectional view schematically showing the main part (the region in which the common electrode is not divided) of the display device incorporating the touch panel therein as reviewed by the inventors.
Figure 9A:
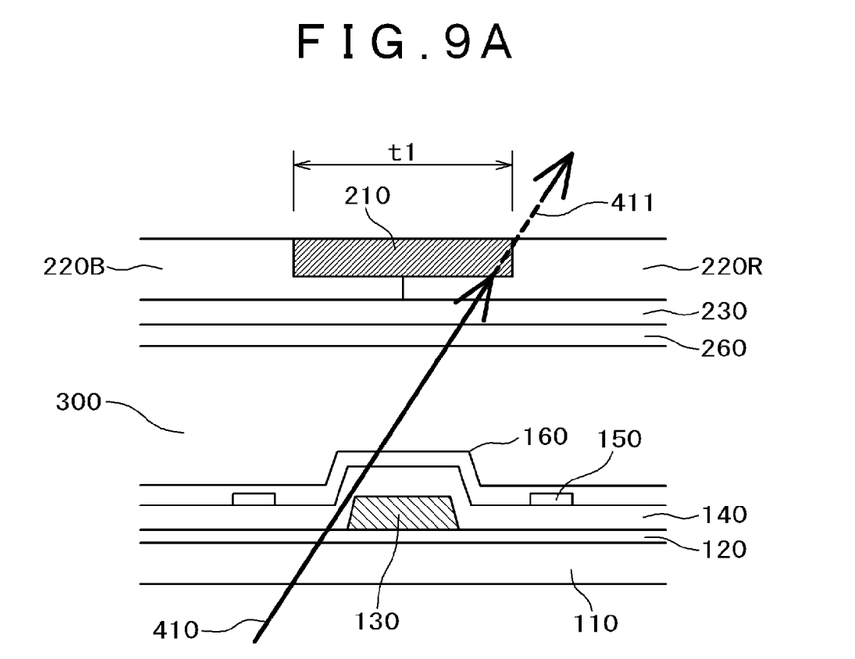
FIG. 9A is a main part cross-sectional view for illustrating the effect to inhibit color mixture between the adjacent subpixels in the display device incorporating the touch panel therein as reviewed by the inventors.

In the structure reviewed by the inventors, when the common electrode is not divided between adjacent subpixels as shown in FIGS. 7A and 7B, the auxiliary wiring (light-blocking metal layer) 130 is arranged in a position overlapping the black matrix 210 as seen vertically from above. Thus, the display device having this structure can use the auxiliary wiring (light-blocking metal layer) as a member for blocking the light from an adjacent subpixel. This point is explained with reference to FIG. 9A. FIG. 9A shows an exemplary case in which a blue filter 220B and a red filter 220R are adjacent to each other. When a light 410 that should pass through the blue filter 220B advances toward the adjacent red filter 220R, there can be a risk of color mixture. In such a case, by arranging the auxiliary wiring (light-blocking metal layer) 130, the light that would cause color mixture if there is no auxiliary wiring is blocked by the auxiliary wiring. Furthermore, it is possible to prevent color mixture because the light 410 having passed by the auxiliary wiring is blocked by the black matrix. Thus, the display device having the structure reviewed by the inventors is effective for prevention of color mixture. It should be noted that the reference numeral 411 denotes the light that is not able to pass therethrough but is blocked.

Figure 9B:
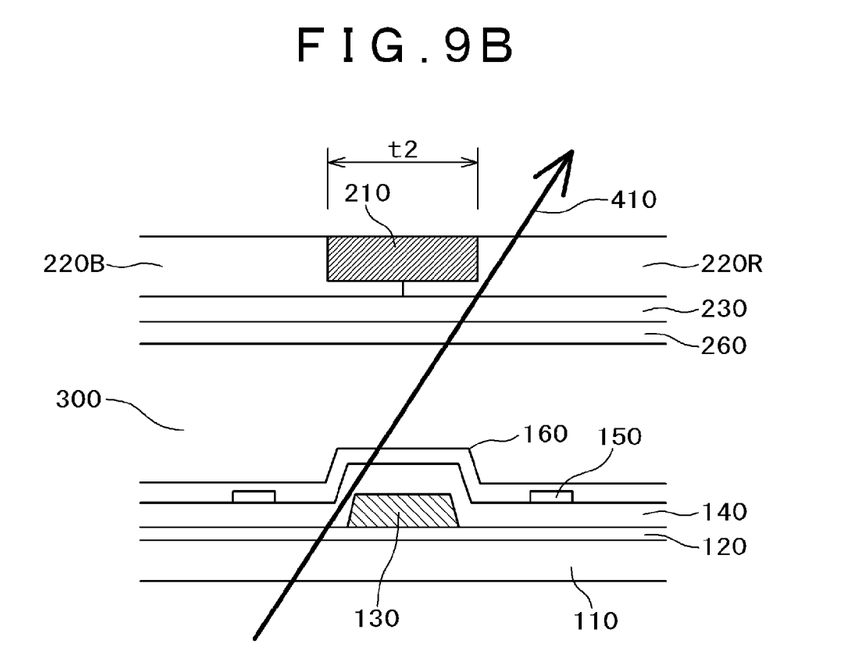
FIG. 9B is a main part cross-sectional view for illustrating a problem of color mixture between the adjacent subpixels in the display device incorporating the touch panel therein as reviewed by the inventors.
Figure 9C:
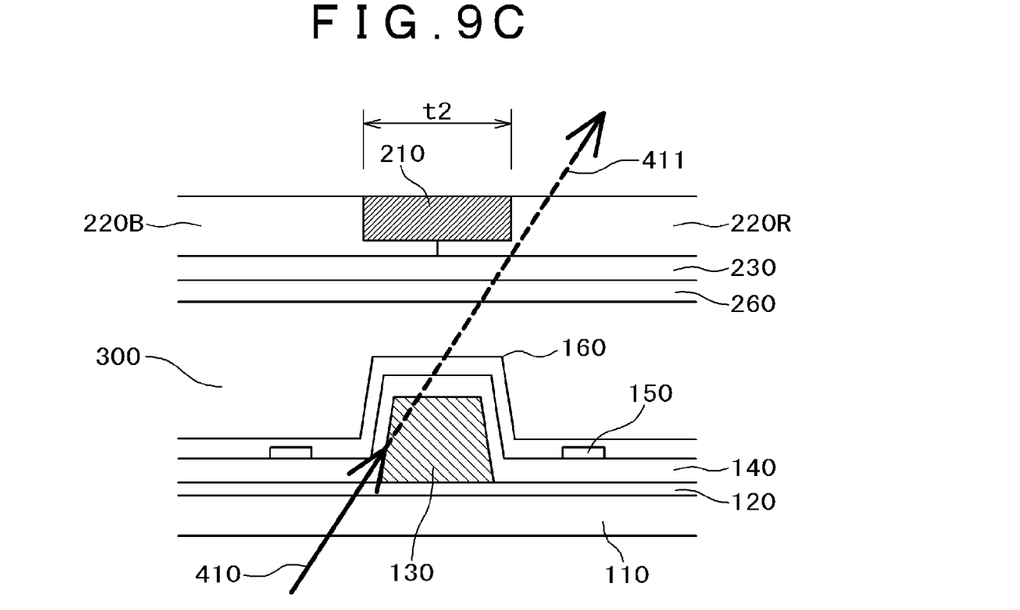
FIG. 9C is a main part cross-sectional view for illustrating a measure for inhibiting color mixture between adjacent subpixels in the display device incorporating the touch panel therein as reviewed by the inventors.

However, if higher definition is required for the display device and, for example, the width of the black matrix is reduced (width:t1>width:t2) in the future, there can be a risk of color mixture between the adjacent subpixels as shown in FIG. 9B. Such measures can be contemplated as to increase the thickness of the metal wiring as shown in FIG. 9C or to increase the thickness of the black matrix, but they may involve other issues that processing of the metal wiring and the black matrix should be time-consuming and cause side etching to make it difficult to obtain a desired shape.

Figure 8A:
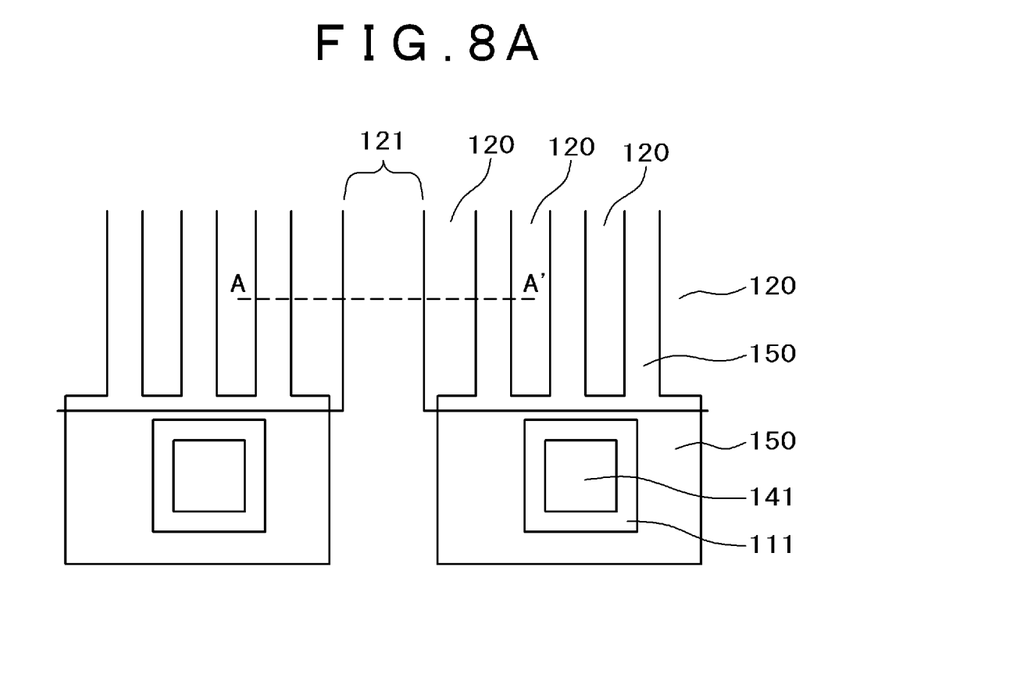
FIG. 8A is a plan view schematically showing the main part (when the common electrode is divided) of the display device incorporating the touch panel therein as reviewed by the inventors.
Figure 8B:
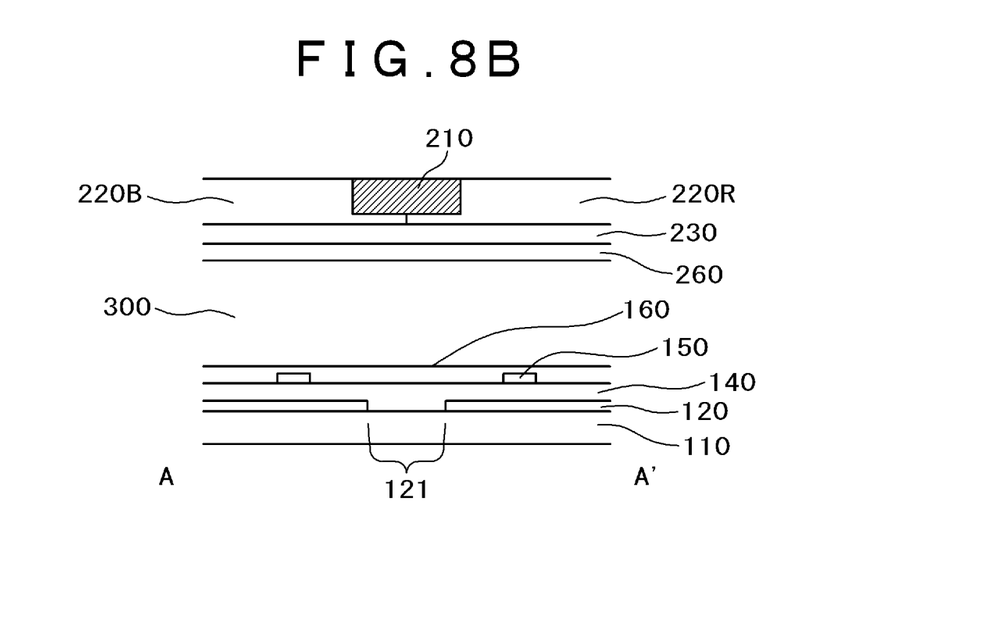
FIG. 8B is a cross-sectional view schematically showing the main part (when the common electrode is divided) of the display device incorporating the touch panel therein as reviewed by the inventors.

Moreover, as shown in FIGS. 8A and 8B, it is required to provide the common electrode slit portion 121 for dividing the common electrode 120 used for the touch sensor, but the auxiliary wiring 130 cannot be arranged that has the same potential, which brings the risk of color mixture between the adjacent subpixels.

It is an object of the present invention to provide a display device inhibiting color mixture between the adjacent subpixels to obtain a high-quality image.

SUMMARY OF THE INVENTION

One embodiment of the invention to achieve the above object is a display device including: a first substrate including a thin-film transistor and a light-blocking metal layer; a second substrate including a black matrix; and a display area formed on a substrate made by laminating the first substrate and the second substrate together and on which a plurality of subpixels are arranged, wherein the plurality of subpixels are arranged adjacent to one another via the black matrix as seen vertically from above, the black matrix and the light-blocking metal layer are arranged to overlap one another as seen vertically from above, and the light-blocking metal layer is arranged on a bank formed on a lower side of the light-blocking metal layer of the first substrate.

Furthermore, a display device includes: a first substrate including a thin-film transistor, a light-blocking metal layer, and a pixel electrode electrically connected to a drain electrode of the thin-film transistor; a second substrate including a black matrix; and a display area formed on a substrate made by laminating the first substrate and the second substrate together and on which a plurality of subpixels are arranged, wherein the plurality of subpixels are arranged adjacent to one another via the black matrix as seen vertically from above, the black matrix and the light-blocking metal layer are arranged to overlap one another as seen vertically from above, and the light-blocking metal layer is arranged on a bank formed on a lower side of the light-blocking metal layer of the first substrate with a bottom face of the light-blocking metal layer arranged at a level higher than the pixel electrode.

Moreover, a display device includes: a first substrate including a thin-film transistor, a scanning signal line electrically connected to a gate electrode of the thin-film transistor, a pixel electrode electrically connected to a drain electrode of the thin-film transistor, a video signal line electrically connected to a source electrode of the thin-film transistor, and a light-blocking metal layer; a second substrate including a black matrix; and a display area formed on a substrate made by laminating the first substrate and the second substrate together and on which a plurality of subpixels are arranged, wherein the plurality of subpixels are arranged adjacent to one another via the black matrix as seen vertically from above, the black matrix, the video signal line, and the light-blocking metal layer are arranged to overlap one another as seen vertically from above, and the light-blocking metal layer is arranged on a bank formed on a lower side of the light-blocking metal layer of the first substrate with a bottom face of the light-blocking metal layer arranged at a level higher than the pixel electrode, and inhibits color mixture between the plurality of adjacent subpixels.

DESCRIPTION OF THE PREFERRED EMBODIMENTS

After reviewing a structure that inhibits color mixture between adjacent subpixels, the inventors focused on the fact that an organic flattened film is relatively easy to process. The present invention has been made on the basis of this new finding, in which a convex portion (bank) is formed by an organic flattened film arranged on an array substrate instead of metal or a black matrix difficult to process, and as thin auxiliary wiring as possible is arranged thereon taking into account the light blocking property and electrical conductivity. This makes it possible to easily inhibit color mixture between the adjacent subpixels. It should be noted that any film can be used to form the convex portion as long as it is easy to process and it is not limited to the organic flattened film. Furthermore, formation of the auxiliary wiring on the bank having a height different from that of the common electrode requires a larger margin compared with the case of forming the auxiliary wiring on a slit portion coplanar with the common electrode, and thus reduces short circuit caused by the auxiliary wiring of the common electrode divided by the slit portion. Note that color mixture caused by the light passing through the bank portion of the organic flattened film at a lower portion of the auxiliary wiring can be ignored.

Hereinafter, embodiments of the present invention will be described with reference to drawings. It should be noted that the present disclosure is merely an example and that any changes that can easily be contemplated by those skilled in the art without departing from the spirit of the invention should naturally fall within the scope of the invention. Moreover, although the drawings may be more schematically represented in terms of the width, thickness, shape, or the like of each portion compared with an actual aspect for more explicit illustration, it is merely an example but not intended to limit the interpretation of the present invention. It should also be noted that elements similar to those already illustrated with reference to a previous drawing are denoted by the same reference numerals throughout the drawings, thereby omitting detailed description thereof.

First Embodiment

A display device according to a first embodiment of the present invention is described with reference to FIGS. 1A, 1B, 3, 4A to 4F, and 6.

Figure 6:
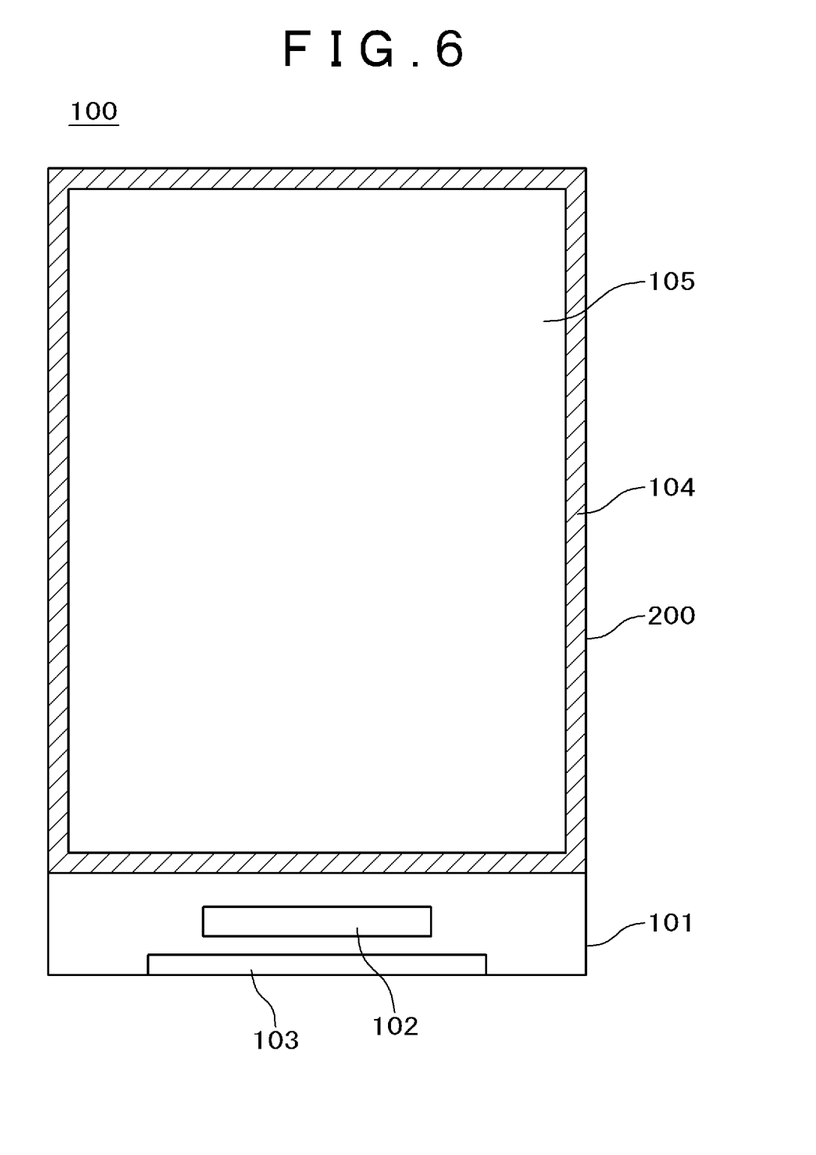
FIG. 6 is a general schematic plan view of the display device according to each embodiment of the present invention.

FIG. 6 is a schematic plan view of the display device according to this embodiment. As shown in FIG. 6, this display device 100 includes a TFT substrate (array substrate) 101, a counter substrate (CF substrate) 200, and a liquid crystal sandwiched between the TFT substrate and the counter substrate. The TFT substrate 101 and the counter substrate 200 are adhered by a sealing material 104. Formed in a display area 105 are a scanning signal line, a video signal line, and pixels arranged in a matrix form. The pixels include a TFT, a pixel electrode, a common electrode, and an auxiliary wiring for reducing resistance of the common electrode. The scanning signal wiring is connected to a gate electrode of the TFT, and formed on the array substrate using the same process and the same material. The video signal line is connected to a source electrode of the TFT, and formed on the array substrate using the same process and the same material. Furthermore, the pixel electrode is connected to a drain electrode of the TFT. It should be noted that the terms such as "source" and "drain" are merely for descriptive purposes and that either one can be referred to as a drain if the other one is referred to as a source. For example, aluminum-silicon alloy (AlSi alloy) or molybdenum-tungsten alloy (MoW alloy) can be used for the source electrode and the drain electrode. For the pixel electrode and the common electrode, a transparent conductive film such as ITO (Indium Tin Oxide) and IZO (Indium Zinc Oxide) can be used. The counter substrate 200 includes a black matrix arranged at a position corresponding to the video signal line, the scanning signal line, the auxiliary wiring, and the like, and a color filter arranged at a position corresponding to a transmissive area of the pixel.

The TFT substrate 101 is larger than the counter substrate 200 and includes a region having only one TFT substrate, in which region a substrate terminal portion 103 being connected to an IC driver (drive circuit) 102 and a flexible wiring board (not shown) is arranged. A backlight, an outer frame, and the like can be combined depending on the application.

Figure 1A:
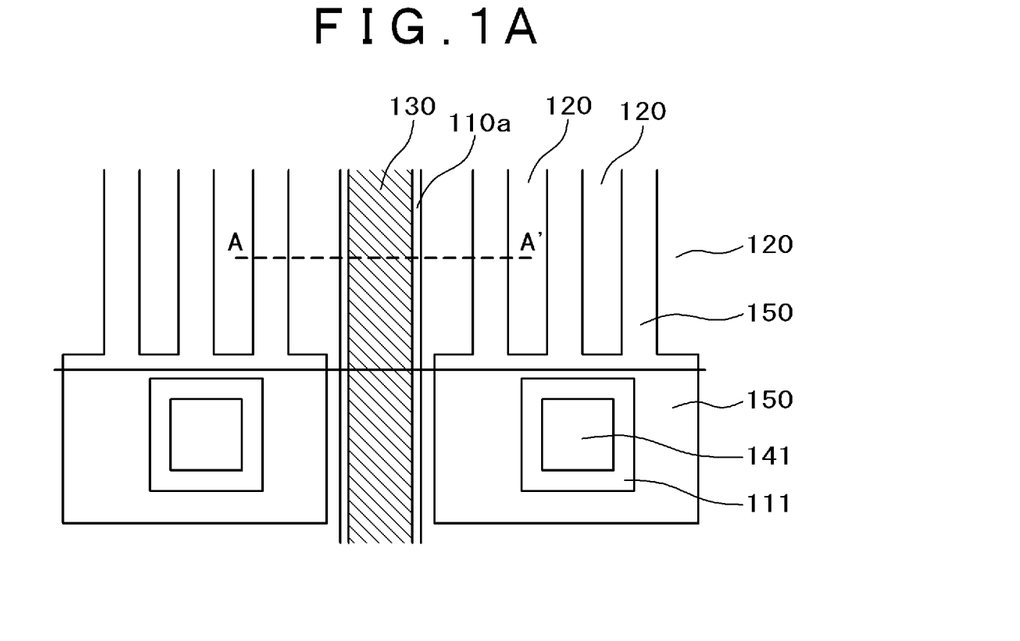
FIG. 1A is a plan view schematically showing a main part of a display device according to a first embodiment of the present invention.
Figure 1B:
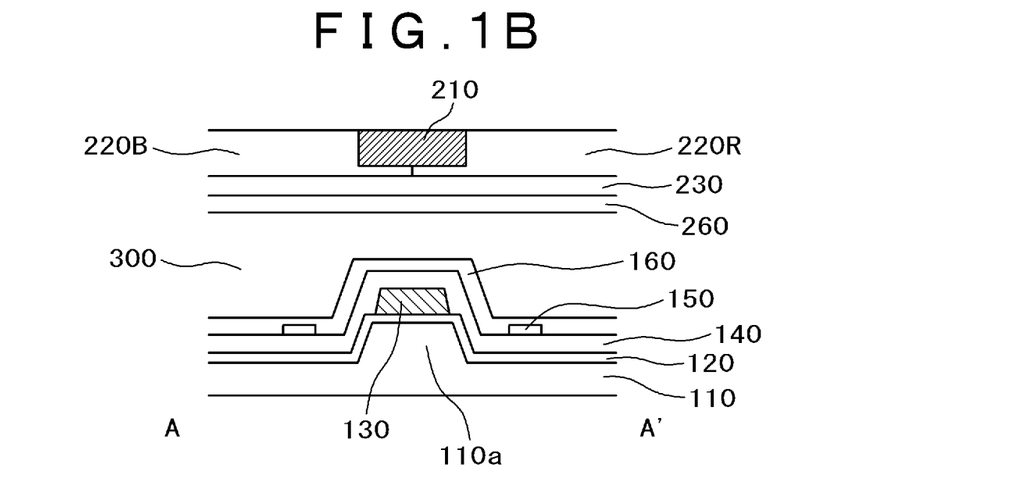
FIG. 1B is a cross-sectional view schematically showing the main part of the display device according to the first embodiment of the present invention.

FIG. 1A shows a plan view of the proximity of the auxiliary wiring of the liquid crystal display device according to this embodiment, and FIG. 1B shows a cross-sectional view of the same. It should be noted, however, that a configuration of the counter substrate is omitted in the plan view. The display device includes the TFT substrate (array substrate), the counter substrate, and a liquid crystal 300 arranged between the array substrate and the counter substrate.

Figure 3:
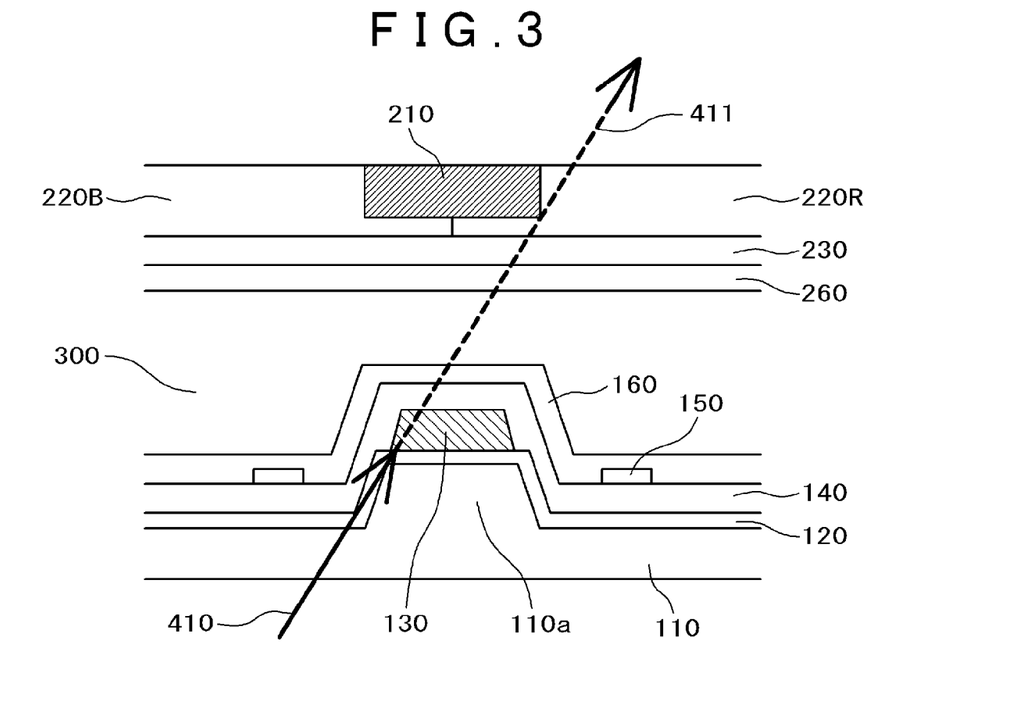
FIG. 3 is a main part cross-sectional view for illustrating an effect to inhibit color mixture between adjacent subpixels in the display device according to the first embodiment of the present invention.

On the array substrate, a common electrode 120 is arranged on the video signal line (signal wiring) via an organic flattened film (HRC) 110. The pixel electrode 150 is arranged on the common electrode 120 via an interlayer insulating film (inorganic insulating film such as SiN) 140. A major difference from the configuration shown in FIGS. 7A and 7B is that an auxiliary wiring (light-blocking metal layer) 130 arranged between the subpixels (between a blue pixel and a red pixel in FIG. 1B) to reduce resistance of the common electrode 120 is arranged on a convex portion (bank) 110a formed in the organic flattened film. This allows for inhibiting color mixture between adjacent subpixels using such a thin auxiliary wiring as shown in FIG. 3 without using a thick auxiliary wiring as shown in FIG. 9C. Color mixture between the subpixels caused by the light having passed through the convex portion of the organic flattened film that is the lower part of the auxiliary wiring can be reduced to a negligible degree by adjusting the height of the convex portion of the organic flattened film taking into account the positions of the black matrix and the signal wiring. Furthermore, the load of processing the auxiliary wiring can be reduced and also the processing dimensional accuracy is not reduced because the auxiliary wiring can be made thinner. By making the height of the auxiliary wiring 130 higher with respect to the pixel electrode 150 (closer to the counter substrate), the light blocking effect can be improved and color mixture between the adjacent subpixels can be reduced. It should be noted that the reference numeral 111 denotes a through hole formed in the organic flattened film and that 141 denotes a through hole formed in the inorganic insulating film.

Formed on the counter substrate side are a black matrix 210, color filters 220 (blue filter 220B, red filter 220R, and the like), an overcoat 230, an alignment film 260, and the like.

A method of manufacturing the display device according to this embodiment, specifically of forming the auxiliary wiring arranged on the convex portion of the organic flattened film on the array substrate side, is now described with reference to FIGS. 4A to 4F.

Figure 4A:
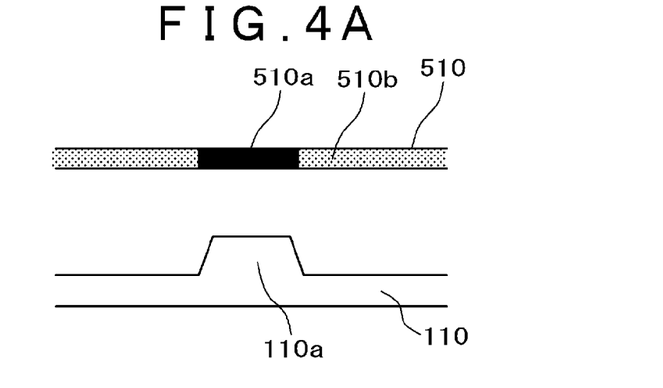
FIG. 4A is a manufacturing process flowchart of display device according to the first embodiment of the present invention (convex portion (bank) forming process on an organic flattened film)

First, the array substrate is prepared having the organic flattened film with 3 μm thickness formed on the scanning signal line, the video signal line, the TFT, or the like. In this embodiment, the convex portion (bank) 110a of the organic flattened film with 500 nm height is formed by exposing the organic flattened film using a positive photosensitive material as the organic flattened film 110 and using a photomask 510 including a light-blocking portion 510a that fully blocks an exposure light and a halftone portion 510b that transmits part of the exposure light and by performing a development and the like. The height of the convex portion 110a of the organic flattened film can be adjusted by an exposure amount (modifiable by changing an exposure time, an intensity of the exposure light, a transmittance of the halftone portion, and the like). This allows for thinning the auxiliary wiring to the desired thickness. The width of the convex portion (bank) is preferably smaller than the width of the black matrix. It should be noted that the convex portion of the organic flattened film can be formed in the same process as the through hole forming process performed on the organic flattened film in order to make contact with an electrode such as the TFT formed on the array substrate. In other words, the process of forming the convex portion on an organic flattened film 135 can be performed at the same time as the conventional through hole forming process on the organic flattened film 135 by using a photomask (halftone mask) 500 including not only the light-blocking portion and the transmissive portion but also the halftone portion.

Figure 4B:
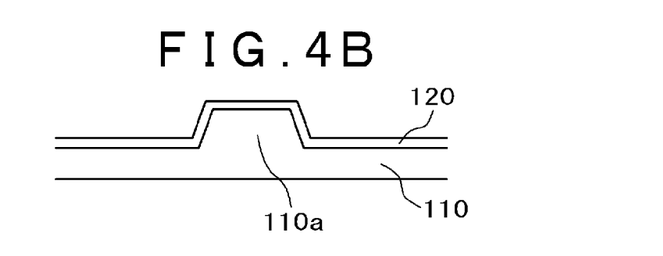
FIG. 4B is a manufacturing process flowchart of display device according to the first embodiment of the present invention (common electrode forming process)
Figure 4C:
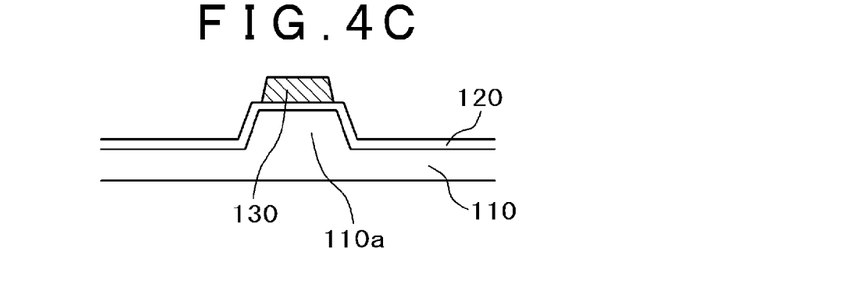
FIG. 4C is a manufacturing process flowchart of display device according to the first embodiment of the present invention (interlayer insulating film forming process)

Next, the common electrode 120 is formed by making and processing an ITO film of 50 nm thickness (FIG. 4B). Subsequently, by making and processing a film of metal of 230 nm thickness, the auxiliary wiring electrically connected to the common electrode is formed on top of the convex portion 110a of the organic flattened film (FIG. 4C). Processing of the auxiliary wiring is performed by lithography and etching. The width of the auxiliary wiring is preferably smaller than the width of the convex portion (bank).

Figure 4D:
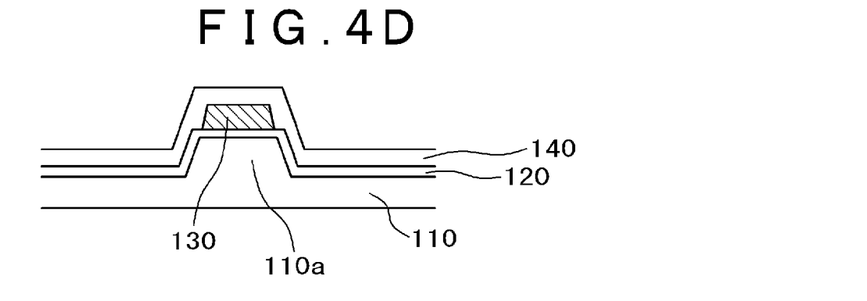
FIG. 4D is a manufacturing process flowchart of display device according to the first embodiment of the present invention (interlayer insulating film forming process)
Figure 4E:
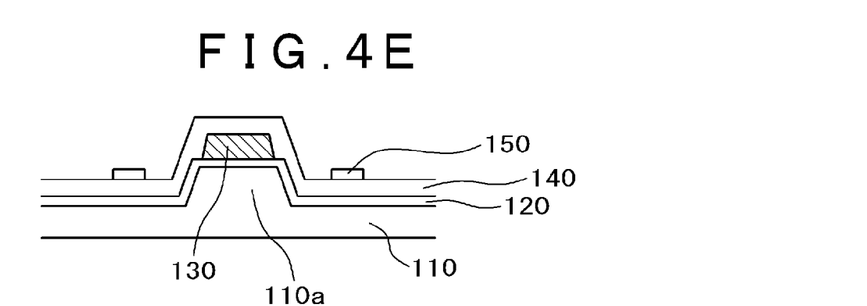
FIG. 4E is a manufacturing process flowchart of display device according to the first embodiment of the present invention (pixel electrode forming process)
Figure 4F:
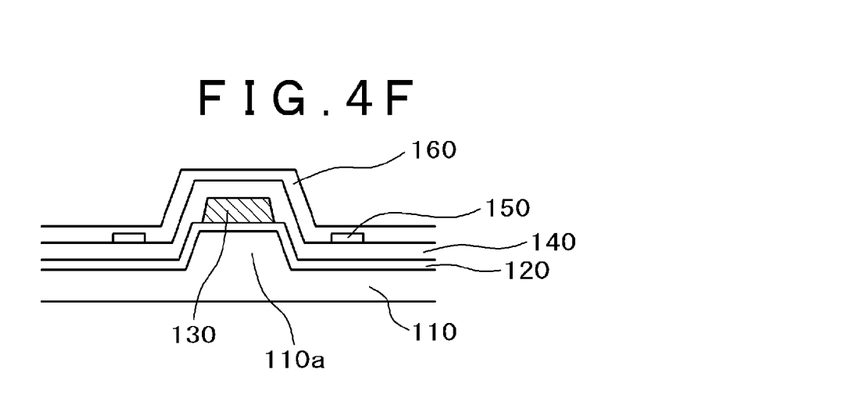
FIG. 4F is a manufacturing process flowchart of display device according to the first embodiment of the present invention (alignment film forming process)

The interlayer insulating film 140 is then formed of, for example, silicon nitride film (SiNx film) to have 180 nm thickness (FIG. 4D). The pixel electrode 150 connected to the drain electrode of the TFT is then formed by making and processing the ITO film (FIG. 4E). At this time, the pixel electrode 150 is arranged to have its height below the level of the lower face of the auxiliary wiring 130. An alignment film 160 is then applied and sintered (FIG. 4F). There is a concern about an alignment failure in the case of an alignment process based on rubbing because the alignment film is formed on a member having a stepped shape such as an organic flattened film having a convex portion or an auxiliary wiring (light-blocking metal layer). In such a case, an optical alignment film may be used. Subsequently, the array substrate and the counter substrate arranged with the color filters and the black matrix are laminated, and the liquid crystal is sealed between the substrates to form the display device. A backlight, an outer frame, and the like can be combined depending on the application. For each manufacturing step, any known process can be used.

Based on the manufacturing method including the processing steps shown in FIGS. 4A to 4F, the auxiliary wiring is formed on the convex portion provided on the organic flattened film as shown in FIG. 1 and the liquid crystal display device is produced as shown in FIG. 6, whereby color mixture between the adjacent subpixels can be inhibited. In particular, by setting the height of the bottom face of the auxiliary wiring at a higher level than the pixel electrode, the color mixture can be reduced. It is also possible to improve the processing dimensional accuracy of the auxiliary wiring by making the auxiliary wiring thinner. This allows for forming a thin auxiliary wiring with less variation and reducing the distance between the adjacent subpixels, thereby achieving further miniaturization and higher definition.

Although the auxiliary wiring for reducing the resistance of the common electrode is used in this embodiment to reduce color mixture between the adjacent subpixels, other metal wiring formed for other purposes can also be used. Furthermore, although the convex portion (bank) for forming the auxiliary wiring is formed using the organic flattened film, it is also possible to use other types of films.

As described above, according to this embodiment, a display device that inhibits color mixture between the adjacent subpixels and allows for obtaining a high-quality image can be provided by arranging the auxiliary wiring (light-blocking metal layer) between the adjacent subpixels on the convex portion of the organic flattened film (convex portion formed in the lower layer). Making the bottom face of the auxiliary wiring higher than the pixel electrode is also effective in inhibiting the color mixture. It is also possible to obtain the light-blocking metal layer with a high dimensional accuracy. This is advantageous for achieving a high definition because it reduces the variation in the wirings and the distance between the subpixels.

Second Embodiment

A second embodiment of the present invention is described with reference to FIGS. 2 and 5A to 5F. It should be noted that what is described in the first embodiment is also applicable to this embodiment unless otherwise specified.

Described in this embodiment is an example of inhibiting color mixture between the adjacent subpixels using the light-blocking metal layer (auxiliary wiring) formed in the slit portion of the common electrode using the same material and the same process as the auxiliary wiring.

Figure 2A:
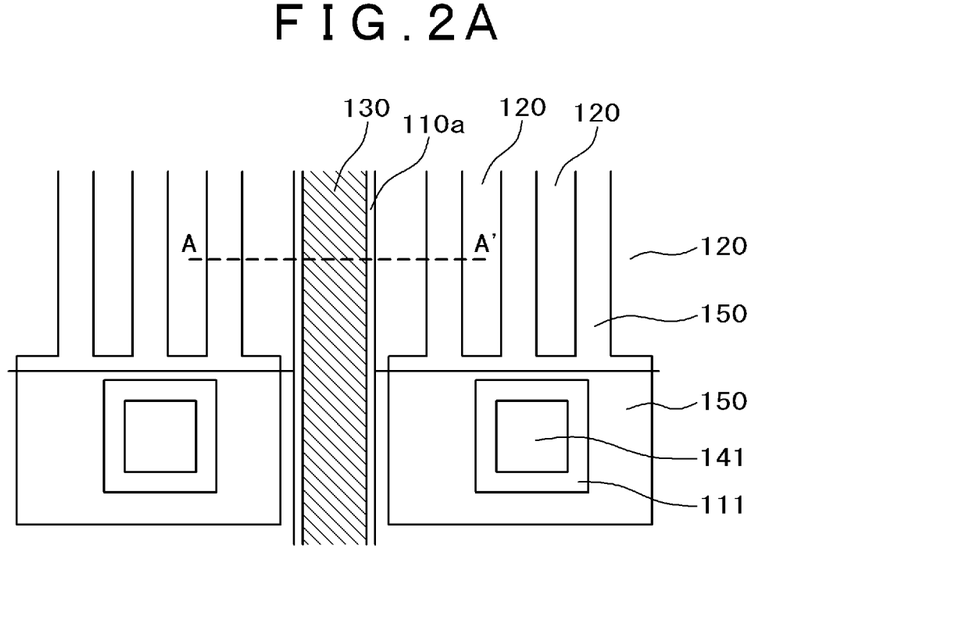
FIG. 2A is a plan view schematically showing a main part of a display device according to a second embodiment of the present invention.
Figure 2B:
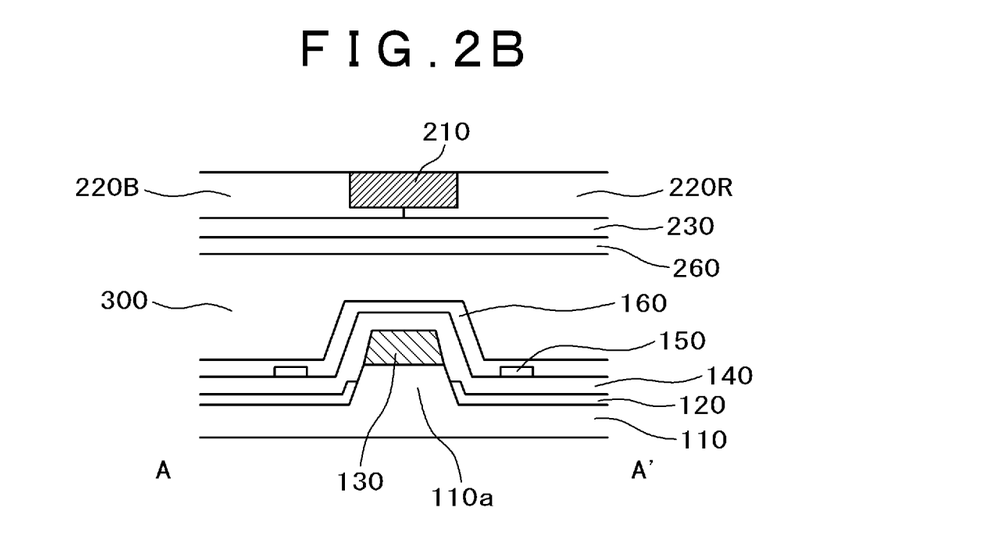
FIG. 2B is a cross-sectional view schematically showing the main part of the display device according to the second embodiment of the present invention.

FIG. 2A is a plan view of the proximity of the auxiliary wiring of the liquid crystal display device according to this embodiment, and FIG. 2B is a cross-sectional view of the same. It should be noted, however, that the configuration of the counter substrate is omitted in the plan view. The display device includes the TFT substrate (array substrate), the counter substrate, and the liquid crystal 300 arranged between the array substrate and the counter substrate.

This embodiment is different from the first embodiment in that the common electrode is divided in the center of the drawing. In the configuration initially reviewed by the inventors as shown in FIGS. 8A and 8B, the divided region (common electrode slit portion) 121 of the common electrode 120 is not provided with the auxiliary wiring 130 so that the common electrodes 120 may not short-circuit one another. In this embodiment, by forming the convex portion on the organic flattened film, the width of the slit portion may not be increased but the production margin for short-circuit is increased compared with the case of forming the common electrode and the auxiliary wiring on the same plane, and thus the adjacent common electrodes will not short-circuit each other even if the auxiliary wiring is formed.

Figure 5A:
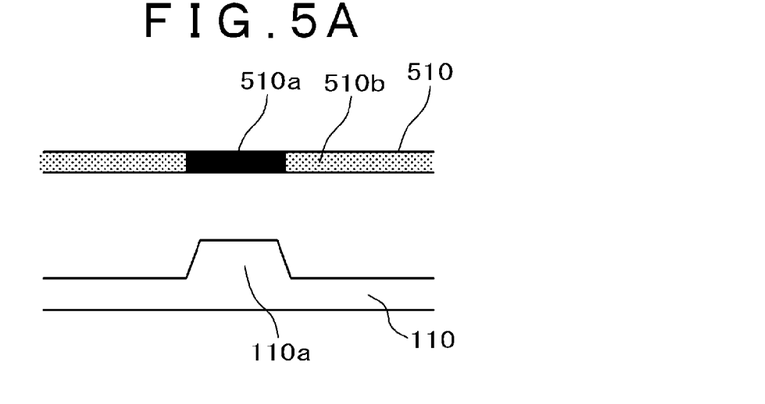
FIG. 5A is a manufacturing process flowchart of display device according to the second embodiment of the present invention (convex portion (bank) forming process on an organic flattened film)
Figure 5B:
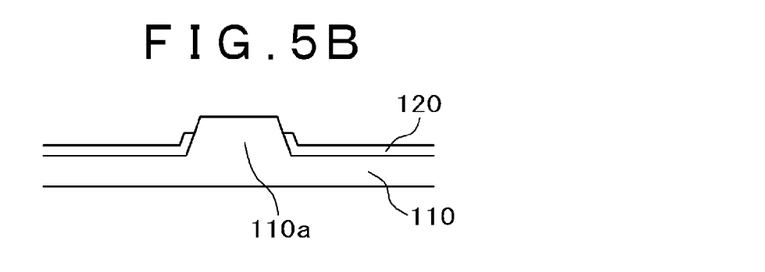
FIG. 5B is a manufacturing process flowchart of display device according to the second embodiment of the present invention (common electrode forming process)
Figure 5C:
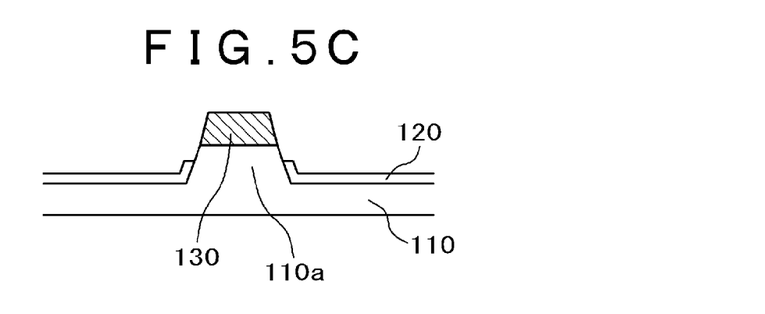
FIG. 5C is a manufacturing process flowchart of display device according to the second embodiment of the present invention (auxiliary wiring forming process)
Figure 5D:
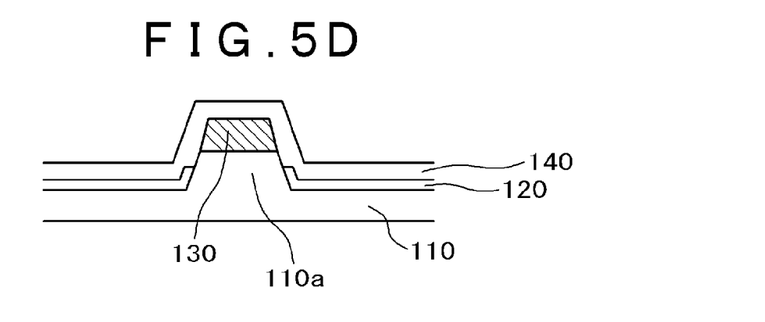
FIG. 5D is a manufacturing process flowchart of display device according to the second embodiment of the present invention (interlayer insulating film forming process)
Figure 5E:
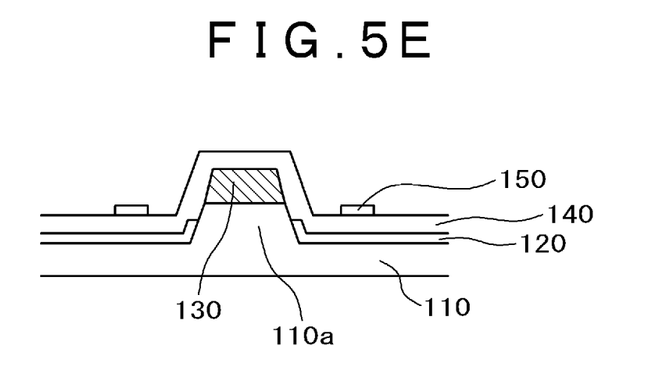
FIG. 5E is a manufacturing process flowchart of display device according to the second embodiment of the present invention (pixel electrode forming process)
Figure 5F:
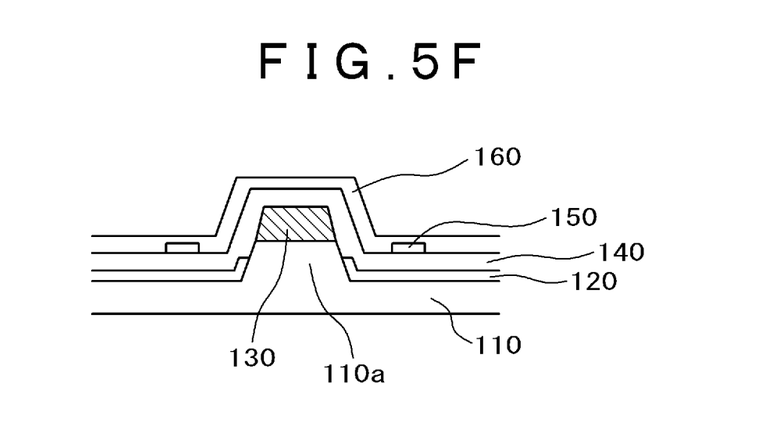
FIG. 5F is a manufacturing process flowchart of display device according to the second embodiment of the present invention (alignment film forming process)

A method of manufacturing the display device according to this embodiment, specifically of forming the auxiliary wiring arranged on the convex portion of the organic flattened film, is now described with reference to FIGS. 5A to 5F. The description thereof is omitted because the method is basically identical to the first embodiment except the common electrode forming process. As shown in FIG. 5A, after forming the convex portion 110a of the organic flattened film 110, the film of ITO is formed all over the array substrate, the ITO on the convex portion (bank) of the organic flattened film is removed by lithography and etching, thereby forming the common electrode having the slit at the convex portion of the organic flattened film (FIG. 5B). The processes shown in FIG. 5C and after are same as those shown in FIG. 4C and after. In FIG. 5C, however, it is possible to increase the production margin for short-circuit between the common electrodes formed on the organic flattened film 110 (between common electrodes divided left and right in FIG. 5C) because the auxiliary electrode 130 is formed on the convex portion 110a of the organic flattened film. This enables an arrangement of the auxiliary wiring in the slit portion of the common electrode where it would be difficult to arrange the auxiliary wiring in the configuration shown in FIG. 8, thereby inhibiting color mixture between the adjacent subpixels.

Based on the manufacturing method including the processing steps shown in FIGS. 5A to 5F, the auxiliary wiring is formed on the convex portion provided on the organic flattened film as shown in FIG. 2 and the liquid crystal display device is produced as shown in FIG. 6, whereby color mixture between the adjacent subpixels can be inhibited without short-circuiting the divided electrodes.

As described above, this embodiment can achieve the same effect as the first embodiment. Moreover, this embodiment can increase the production margin for short-circuit between adjacent wirings.

Although some embodiments of the present invention are described above, these embodiments are merely exemplary but not intended to limit the scope of the invention. The present invention consists in arranging the light-blocking metal layer on top of the underlying convex portion between the adjacent subpixels where the black matrix would be arranged. A novel embodiment that may derive from this concept can be carried out in various other forms, and an omission, replacement, or modification can be performed without departing from the spirit of the invention. These embodiments and variations thereof are included in the scope and spirit of the invention, and also included in the scope of the invention described in the appended claims and equivalents thereof.

Within the concept of the invention, those skilled in the art can of course come up with various modifications and alterations, which are understood to be included in the scope of the invention. For example, those skilled in the art can add constituents to, delete constituents from, modify the design of, add a processing step to, delete the step from or change a condition of each of the embodiments described above as desired within the scope of the invention as long as it stays in the spirit of the invention. Other effects brought by the aspects described in the embodiments that are apparent from the description or that can be easily contemplated by those skilled in the art are naturally understood to be brought by the invention.

What is claimed is:

1. A display device comprising: a first substrate including a thin-film transistor and a light-blocking metal layer; a second substrate including a black matrix; and a display area formed on a substrate made by laminating the first substrate and the second substrate together and on which a plurality of subpixels are arranged, wherein
the plurality of subpixels are arranged adjacent to one another via the black matrix as seen vertically from above,
the black matrix and the light-blocking metal layer are arranged to overlap one another as seen vertically from above, and
the light-blocking metal layer is arranged on a bank formed on a lower side of the light-blocking metal layer of the first substrate.

2. The display device according to claim 1, wherein
the light-blocking metal layer has a function of inhibiting color mixture between the plurality of adjacent subpixels.

3. The display device according to claim 2, wherein
the display device incorporates a touch panel in the display device, and
the light-blocking metal layer is arranged on the bank via a common electrode to be an electrode of the touch panel and has a function of reducing resistance of the common electrode.

4. The display device according to claim 2, wherein
the display device incorporates a touch panel in the display device, and
the light-blocking metal layer is arranged at a slit portion that divides a common electrode to be an electrode of the touch panel.

5. The display device according to claim 1, wherein
a video signal line connected to a source electrode of the thin-film transistor is arranged to overlap the light-blocking metal layer as seen vertically from above.

6. The display device according to claim 1, wherein
the bank is formed on an organic flattened film arranged on top of the thin-film transistor.

7. The display device according to claim 1, wherein
an alignment film is arranged on top of the light-blocking metal layer, and
the alignment film is an optical alignment film.

8. A display device comprising: a first substrate including a thin-film transistor, a light-blocking metal layer, and a pixel electrode electrically connected to a drain electrode of the thin-film transistor; a second substrate including a black matrix; and a display area formed on a substrate made by laminating the first substrate and the second substrate together and on which a plurality of subpixels are arranged, wherein
the plurality of subpixels are arranged adjacent to one another via the black matrix as seen vertically from above,
the black matrix and the light-blocking metal layer are arranged to overlap one another as seen vertically from above, and
the light-blocking metal layer is arranged on a bank formed on a lower side of the light-blocking metal layer of the first substrate with a bottom face of the light-blocking metal layer arranged at a level higher than the pixel electrode.

9. The display device according to claim 8, wherein
the light-blocking metal layer has a function of inhibiting color mixture between the plurality of adjacent subpixels.

10. The display device according to claim 9, wherein
the display device incorporates a touch panel in the display device, and the light-blocking metal layer is arranged on the bank via a common electrode to be an electrode of the touch panel and has a function of reducing resistance of the common electrode.

11. The display device according to claim 9, wherein the display device incorporates a touch panel in the display device, and
the light-blocking metal layer is arranged at a slit portion that divides a common electrode to be an electrode of the touch panel.

12. The display device according to claim 8, wherein a video signal line connected to a source electrode of the thin-film transistor is arranged to overlap the light-blocking metal layer as seen vertically from above.

13. The display device according to claim 8, wherein the bank is formed on an organic flattened film arranged on top of the thin-film transistor.

14. The display device according to claim 8, wherein an alignment film is arranged on top of the light-blocking metal layer, and
the alignment film is an optical alignment film.

15. A display device comprising: a first substrate including a thin-film transistor, a scanning signal line electrically connected to a gate electrode of the thin-film transistor, a pixel electrode electrically connected to a drain electrode of the thin-film transistor, a video signal line electrically connected to a source electrode of the thin-film transistor, and a light-blocking metal layer; a second substrate including a black matrix; and a display area formed on a substrate made by laminating the first substrate and the second substrate together and on which a plurality of subpixels are arranged, wherein
　the plurality of subpixels are arranged adjacent to one another via the black matrix as seen vertically from above,
　the black matrix, the video signal line, and the light-blocking metal layer are arranged to overlap one another as seen vertically from above, and
　the black matrix, the video signal line, and the light-blocking metal layer are arranged to overlap one another as seen vertically from above, and
　the light-blocking metal layer is arranged on a bank formed on a lower side of the light-blocking metal layer of the first substrate with a bottom face of the light-blocking metal layer arranged at a level higher than the pixel electrode, and inhibits color mixture between the plurality of adjacent subpixels.

* * * * *